United States Patent
Humphreys

(10) Patent No.: US 6,211,583 B1
(45) Date of Patent: Apr. 3, 2001

(54) HIGH SPEED CURRENT SWITCH

(75) Inventor: Scott Robert Humphreys, Boynton Beach, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/395,267

(22) Filed: Sep. 13, 1999

(51) Int. Cl.[7] ............................. H03M 1/66; H02H 3/26
(52) U.S. Cl. ................................. 307/131; 341/144
(58) Field of Search .......................... 307/131, 115, 307/116; 341/136, 144

(56) References Cited

U.S. PATENT DOCUMENTS

| | | |
|---|---|---|
| 5,136,293 * | 8/1992 | Matsuo et al. .................... 341/144 |
| 5,329,192 | 7/1994 | Wu et al. . |
| 5,373,294 | 12/1994 | Sun . |
| 5,463,394 | 10/1995 | Sun . |
| 5,548,288 * | 8/1996 | Lueng .............................. 341/136 |
| 5,965,958 * | 10/1999 | Harwood .......................... 307/131 |
| 6,100,738 * | 8/2000 | Illegems .......................... 327/165 |

* cited by examiner

Primary Examiner—Josie Ballato
Assistant Examiner—Rios Cuevas Roberto
(74) Attorney, Agent, or Firm—Randi L. Dulaney

(57) ABSTRACT

A high-speed current switch (36) comprises a differential switch (14), a current source (12), an op-amp (32), a feedback switch (38), a hold capacitor (40), a biasing transistor (42), and a second current switch (44). The high-speed current switch (36) receives a complementary control signal (46) and a control signal (48), and generates an output current (26).

7 Claims, 3 Drawing Sheets

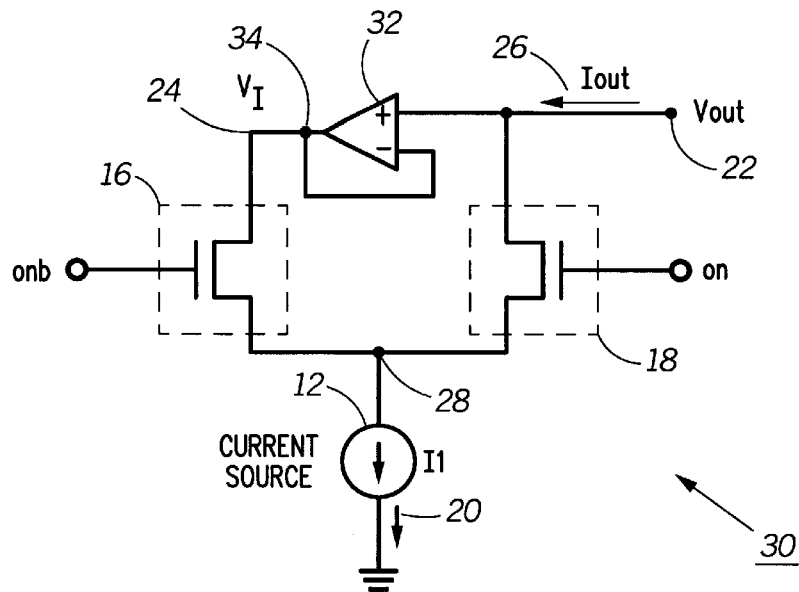
PRIOR ART  FIG. 3
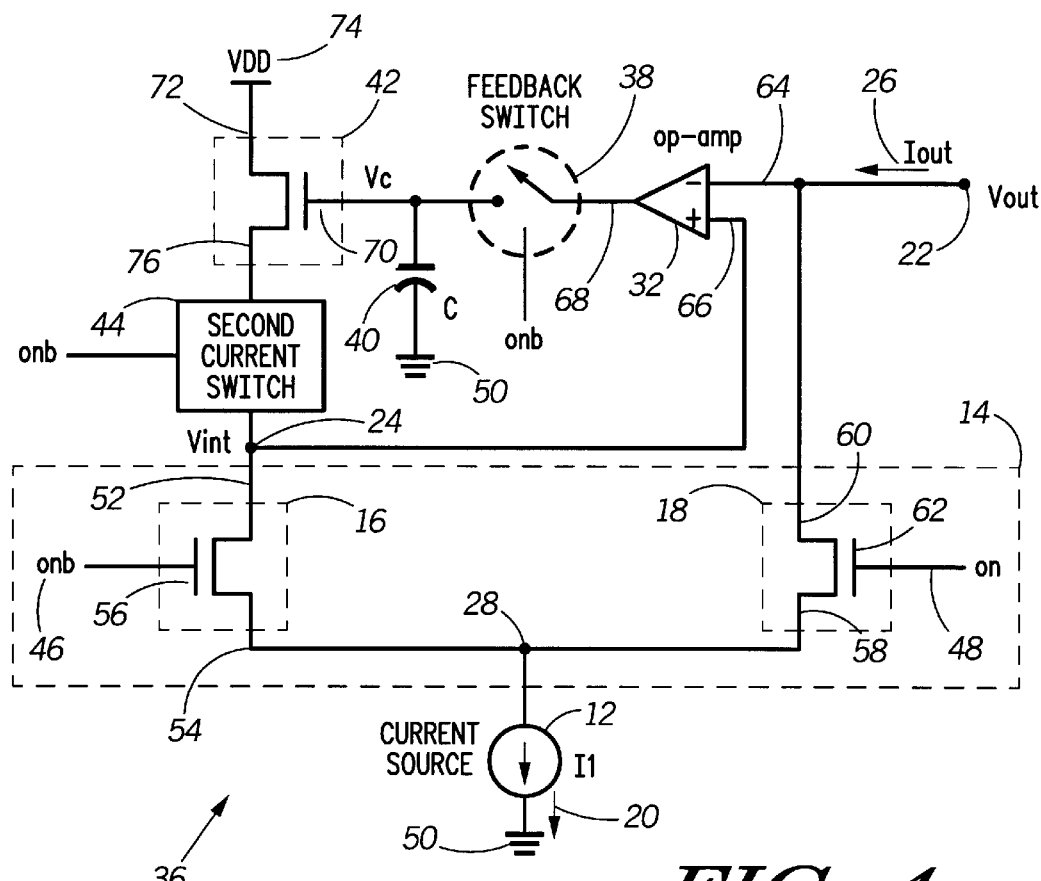
FIG. 4

| COMPONET | SWITCH OFF STATE | SWITCH ON STATE |
|---|---|---|
| COMPLEMENTARY CONTROL SIGNAL (46) | HIGH | LOW |
| CONTROL SIGNAL (48) | LOW | HIGH |
| FEED BACK SWITCH | ON | OFF |
| SECOND CURRENT SWITCH (44) | ON | OFF |
| FIRST TRANSISTOR (16) | ON | OFF |
| SECOND TRANSISTOR (18) | OFF | ON |
| HOLD CAPACITOR (40) | CHARGING | HOLDING |
| INTERNAL NODE (24) | STABILIZING | HOLDING |

HIGH SPEED CURRENT SWITCH

BACKGROUND OF THE INVENTION

1. Field of the Invention

This invention relates in general to current switches and in particular to a high-speed current switch suitable for use in high speed electronic systems.

2. Description of the Related Art

In many electronic systems it is important to rapidly switch a current on or off, or to rapidly redirect the current. The faster the current is switched or redirected, the more ideal the behavior of the overall circuit which the switch is supporting. High speed current switching is useful in digital-to-analog converters (DACs) for high performance audio such as compact disc (CD) players and direct digital synthesizers used in communication base stations. Further, high speed current switching is useful in current-mode (or charge pump) phase locked loop (PLL) circuits to improve noise and spurs performance.

Historically, a simple series switch 10 as shown in FIG. 1 was implemented using a single bipolar or field effect transistor to turn on and off a current source 12. When the simple series switch 10 was in the open position, the current source 12 was forced to shut down, thereby drawing no current. When the simple series switch 10 was in the closed position, the current source 12 drew current. A drawback of the simple series switch 10 was that when the current source device was turned off it was slow to turn back on, thereby causing the simple series switch 10 to be unsuitable for use in high performance DACs and PLLs.

Various approaches have been tried to improve the high-speed performance of these current switches. One such approach used a differential switch 14 as shown in FIG. 2. The differential switch 14 could be designed using metal oxide semiconductor field effect transistor (MOSFET), metal semiconductor field effect transistor (MESFET), or bipolar technology. The differential switch 14 of FIG. 2 comprised a first transistor 16 and a second transistor 18 that acted as switches to steer a source current 20 between an output terminal 22 and an internal node 24. An output current 26 would be either zero or the value of the source current 20 depending on the state of the control signal. Because the current was steered to the output, the current source 12 was always on. For this reason, the differential switch 14 was able to switch the output current 26 on arid off significantly faster than the simple series switch 10, which forced the current source to shut down when the switch was opened.

The differential switch 14 shown in FIG. 2 had limitations that slowed its operation. When on, FET or bipolar devices stored a charge inside the device in the inversion layer or in the space-charge region. The amount of charge is a function of the internal device capacitance and the terminal voltages of the device. For example, in a MOSFET the stored inversion layer charge is a function of the inversion layer capacitance, gate oxide capacitance, and the gate-source voltage (Vgs) and the drain-source voltage (Vds). In the differential switch 14 of FIG. 2, the voltage at the internal node 24 probably was different from the voltage at the output terminal 22, and the amount of charge stored in the first transistor 16 was typically different than that in the second transistor 18. When the differential switch 14 changed state, the difference in charge must be transferred from parasitic capacitance in the circuit, and this modulated the voltage at a tail node 28. This modulation of the voltage of the tail node 28 caused the output switch Vgs to vary, slowing the process of turning the device on and settling the output current 26. In addition, variations in the voltage at the tail node 28 and any charge drawn from the output terminal 22 would create a spike of current at the output terminal 22 that took some time to settle. Part of this current spike was the charge difference needed for storage when the second transistor 18 was on. The current spike developed at the output terminal 22 increased the settle time of the output current 26 and could degrade the performance of the overall circuit that the current source 12 was supporting.

Recently, the limitations of the differential switch 14 have been improved on by forcing the voltage at the output terminal 22 and the voltage at the internal node 24 to be equal. When the first transistor 16 and the second transistor 18 are on, the charge differences are minimized and the switch will react more rapidly. One method of forcing the two terminal voltages to be equal is described in an article by Howard C. Yang, et al., entitled "A Low Jitter 0.3–165 MHz CMOS PLL Frequency Synthesizer for 3V/5V Operation", *IEEE Journal of Solid State Circuits,* V32, N4, pp.582–586, April 1997.

A balanced current switch 30 as described in the Yang et al. article is reproduced in FIG. 3. The reference numbers of the differential switch 14 of FIG. 2 have been retained for those elements that are common. The balanced current switch 30 of FIG. 3 includes all the elements and functionality of the differential switch 14 illustrated in FIG. 2 and further comprises an operational amplifier (op-amp) 32. In the balanced current switch 30, the op-amp 32 is connected in a unity-gain buffer configuration such that it forces the voltage at the internal node 24 to track the voltage at the output terminal 22. Because the terminal voltages of the first transistor 16 and the second transistor 18 are equalized, the charge stored in each transistor (when each is on) is equalized as well. This significantly reduces the amount of charge that is drawn from parasitic capacitance in the circuit, and from the output node or the tail node, improving the settle time of the switch.

Although possessing improved performance over the differential switch 14, the balanced current switch 30 still has drawbacks. The primary drawback of the balanced current switch 30 is that the op-amp output current 34 must rapidly switch between the source current 20 and zero when the current is steered to the output. Thus, the bandwidth and slew rate of the op-amp 32 constrains the reaction time of the feedback system, and therefore, the speed of the balanced current switch 30. An additional drawback of the balanced current switch 30 is that the op-amp 32 must be able to source a current equal to the source current 20, which can be quite large. This makes the op-amp design problem very difficult. The op-amp is required to simultaneously meet large output current and wide bandwidth and high slew rate constraints. The high performance op-amp required to meet these specifications would typically consume high current drain, be significantly large in size, and thus costly, which are undesirable in battery operated, portable products.

Despite the development of techniques such as those described previously above, a need still remains for improving the performance of high-speed current switches without the use of high performance operational amplifiers.

BRIEF DESCRIPTION OF THE SEVERAL VIEWS OF THE DRAWINGS

FIGS. 1, 2, and 3 are schematic diagrams of prior art switches;

FIG. 4 is a schematic diagram of a high-speed current switch in accordance with the present invention;

DETAILED DESCRIPTION OF THE INVENTION

Figure 1:
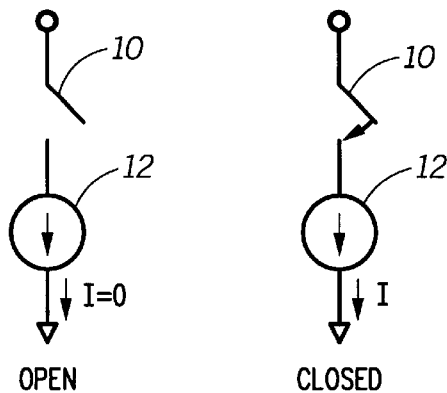

Referring to FIG. 4, a schematic diagram of a high-speed current switch 36 is shown. The high-speed current switch 36 can be designed using metal oxide semiconductor field effect transistor (MOSFET), metal semiconductor field effect transistor (MESFET), or bipolar technology. Preferably, the high-speed current switch 36 is implemented using a low cost standard digital process such as 0.25-micron gate length complementary metal oxide semiconductor (CMOS) technology. One skilled in the art will recognize that other processes may also be utilized to implement the high-speed current switch 36. The reference numbers of the differential switch 14 of FIG. 2 and the balanced current switch 30 of FIG. 3 have been retained for those elements that are common. The high-speed current switch 36 of FIG. 4 comprises the differential switch 14, the current source 12, the op-amp 32, a feedback switch 38, a hold capacitor 40, a biasing transistor 42, and a second current switch 44. The high-speed current switch 36 receives a complementary control signal 46, and a control signal 48, and generates the output current 26 at the output terminal 22.

As illustrated in FIG. 4, the output of the current source 12 is coupled to a ground node 50. The current source 12 remains on at all times, as in the balanced current switch 30 of FIG. 3, eliminating the need for additional stabilization time of the current source 12 when switched. The current source 12 sinks current from and is coupled to the differential switch 14 at the tail node 28 of the pair. The differential switch 14 steers the current to either the internal node 24 or the output terminal 22 depending on the states of the control signal 48 and the complementary control signal 46.

Preferably, the differential switch 14 comprises the first transistor 16 and the second transistor 18. The first transistor 16 includes a first drain 52 coupled to the internal node 24, a first source 54 coupled to the current source 12, and a first gate 56 that receives the complementary control signal 46. The second transistor 18 includes a second source 58 coupled to the first source 54 and also coupled to the current source 12, a second drain 60 coupled to the output terminal 22, and a second gate 62 that receives the control signal 48.

The op-amp 32 includes a first op-amp input 64 coupled to the output terminal 22, a second op-amp input 66 coupled to the internal node 24, and an op-amp output 68 coupled to a feedback switch 38. The op-amp 32 provides gain for the feedback loop comprising the biasing transistor 42, the second current switch 44, the internal node 24, and the op-amp 32.

The feedback switch 38 is coupled to the op-amp output 68. The feedback switch 38 is further coupled to the biasing gate 70 of the biasing transistor 42. The feedback switch 38 closes or opens the connection between the op-amp output 68 and the biasing gate 70. The feedback switch 38 is closed (making the connection) when the source current 20 is steered to the internal node 24. This state is referred to as the "off" state of the high-speed current switch 36. The feedback switch 38 is open when the source current 20 is steered to the output terminal 22. This state is referred to as the "on" state of the high-speed current switch 36.

Preferably, the high-speed current switch 36 includes the hold capacitor 40 coupled between the output of the feedback switch 38 and the ground node 50. In one embodiment, the hold capacitor 40 comprises the gate capacitance of the biasing transistor 42. Alternatively, the hold capacitor 40 is a discrete capacitor. The hold capacitor 40 stores charge sufficient to maintain the voltage of the biasing gate 70 of the biasing transistor 42 when the feedback switch 38 is open. This helps to smooth the transition between the on and off states of the high speed current switch 36. The hold capacitor 40 is charged by the op-amp 32 through the feedback switch 38. By increasing the capacitance at the biasing gate 70, the voltage at the biasing gate 70 will be less susceptible to disturbance from the switching of the feedback switch 38.

The biasing transistor 42 comprises a biasing gate 70 coupled to the output of the feedback switch 38 and the hold capacitor 40, a biasing source 72 coupled to a supply node 74, and a biasing drain 76 coupled to the second current switch 44. Preferably, the biasing transistor 42 is a PMOS transistor. The biasing transistor 42 provides current to the differential switch 14 when the high-speed current switch 36 is in the off state. The feedback loop formed by the op-amp 32 and the biasing transistor 42 forces the voltage of the internal node 24 to be substantially equal to the voltage at the output terminal 22. The voltage at the internal node 24 when the high-speed current switch 36 is in the off state is referred to as its settled value.

The second current switch 44 includes an input coupled to the biasing drain 76 of the biasing transistor 42, and an output coupled to the internal node 24. The second current switch 44 closes or opens the connection between the biasing transistor 42 and the internal node 24. The second current switch 44 is closed when the high-speed current switch 36 is in the off state, and is open when the high-speed current switch 36 is in the on state. By disconnecting the biasing transistor 42 from the internal node 24, the voltage of the internal node 24 can be maintained close to its settled value when the high-speed current switch 36 is in the on state.

Figure 2:
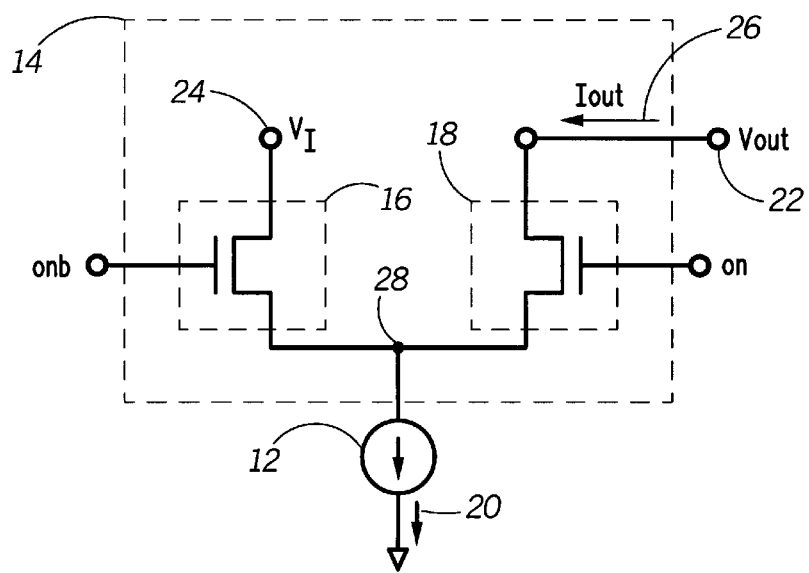

In one embodiment, the second current switch 44 comprises a simple series switch 10 as shown in FIG. 1 and previously described. Alternatively, the second current switch 44 comprises a differential switch 14 as shown in FIG. 2 and previously described. The first transistor 16 and the second transistor 18 of the differential switch 14 in this embodiment are preferably PMOS transistors. One skilled in the art will recognize that the second current switch 44 may comprise one of the previously mentioned current switches or an equivalent.

Figures 5, 6:
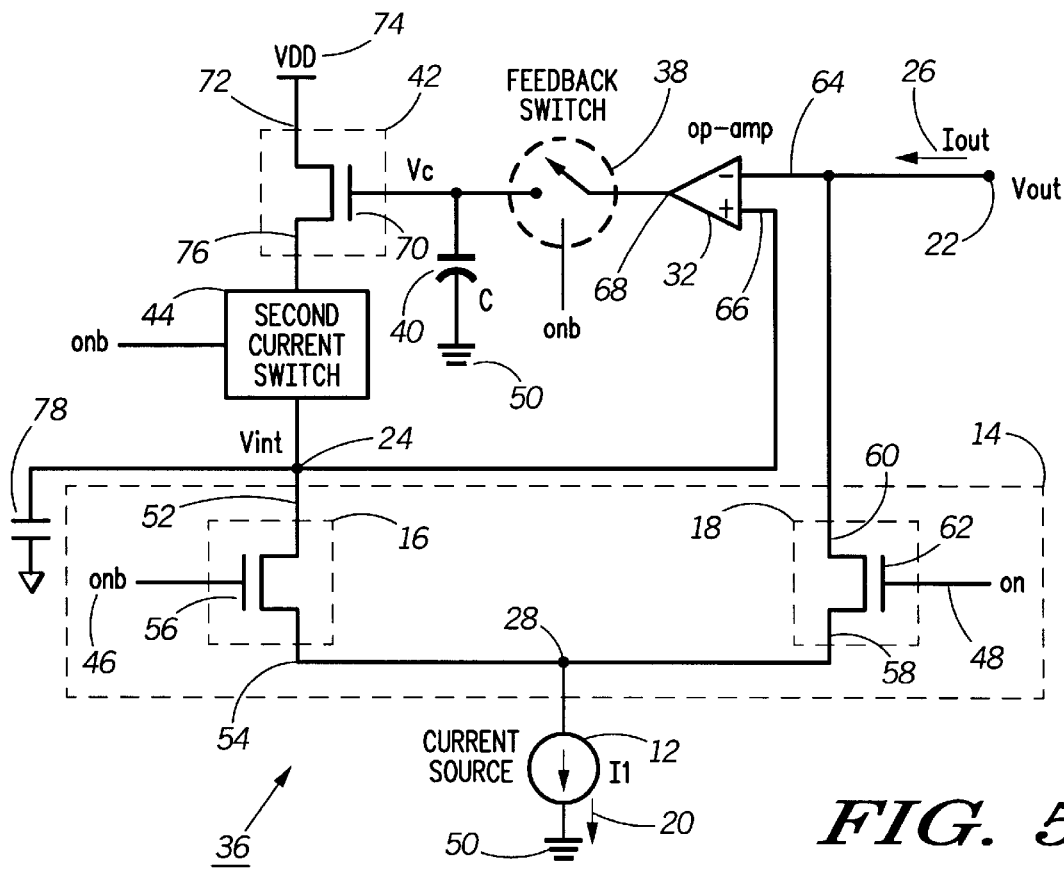
FIG. 5 is a schematic diagram of an alternate embodiment of the high-speed current switch of FIG. 4.
FIG. 6 is a table illustrating the states of each component of the high-speed current switch of FIG. 4.

FIG. 5 illustrates an alternative embodiment of the high-speed current switch 36 of FIG. 4. In FIG. 5, the high-speed current switch 36 further comprises a second capacitor 78 having a first side coupled to the internal node 24 and a second side coupled to the ground node 50. The second capacitor 78 functions to improve the stability of the voltage of the internal node 24 during transitions between the "off" and "on" states of the high-speed current switch 36. By increasing the capacitance at the internal node 24, the voltage at the internal node 24 will be less susceptible to disturbance from the switching of the first transistor 16 and the second current switch 44. By maintaining the voltage of the internal node 24 at its settled value the switching time of the high-speed current switch 36 is minimized, as no further settling is required at the internal node 24.

FIG. 6 shows a table illustrating the states of each component of the high-speed current switch 36. In operation, the high-speed current switch 36 operates to minimize transients in the output current 26. When the complementary control signal 46 is high and the control signal 48 is low, the output current 26 is off. When the output current 26 is off, the op-amp 32 and the hold capacitor 40 form a feedback loop. This feedback loop adjusts the current in the biasing transistor 42 to be equal to the source current 20; and adjusts the drain voltage of the biasing transistor 42 to be equal to the voltage at the output terminal 22. The voltage stored on the hold capacitor 40 controls that current. When the complementary control signal 46 is low and the control signal 48 is high, the current is switched to the output, and the feedback loop is broken, while the control voltage is maintained on the hold capacitor 40. When the complementary control signal 46 is high and the control signal 48 is low again, the output current 26 is switched off, and the feedback loop is reconnected with minimal disturbance.

The feedback loop acts to maintain the terminal voltages of the first transistor 15 and the second transistor 18 essentially equal, equalizing the amount of stored charge in the channels of the transistors when they are on. Because the transistors require essentially the same charge, this charge can flow from one transistor to the other when the state of the control signal changes. No other charge will be drawn out of or injected into the surrounding circuitry, minimizing the settling time of the high-speed current switch 36.

The second current switch 44 and the feedback switch 38 close when the control signal 48 is low and the complementary control signal 46 is high. Both the feedback switch 38 and the second current switch 44 can be implemented using a single transistor, however a preferable arrangement is to use a differential current switch for the second current switch. This allows the biasing transistor 42 to stay on, improving the speed at which the voltages and currents stabilize when the output current 26 is switched off.

The invention described herein provides a significant improvement in settle time for current switching over the prior art. For example, simulation indicates that in a typical 0.25 micron CMOS process, the balanced current switch 30 has a settle time of approximately 20 to 100 nanoseconds. The high-speed current switch 36 provides a settle time of between 0.3 and 1.3 nanoseconds, an improvement of about ten times over the prior art. An additional benefit of the high-speed current switch 36 is that it has no special requirements regarding the voltage swing of the control signal 48 and complementary control signal 46.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. A high-speed current switch receiving a control signal and a complementary, control signal, and having an output terminal, an internal node, a supply node, and a ground node, the high-speed current switch comprising:
    a current source coupled to the ground node;
    a differential switch coupled to the current source, the internal node, and the output terminal, wherein the differential switch receives the control signal and the complementary control signal;
    an op-amp having a first op-amp input coupled to the output terminal, a second op-amp input coupled to the internal node, and an op-amp output;
    a feedback switch coupled to the op-amp output;
    a biasing transistor having a biasing gate coupled to the output of the feedback switch, a biasing source coupled to the supply node, and a biasing drain; and
    a second current switch, coupled between the drain of the biasing transistor and the internal node.

2. A high-speed current switch as recited in claim 1 further comprising:
    a hold capacitor coupled between the output of the feedback switch and the ground.

3. A high-speed current switch as recited in claim 1, wherein the differential switch comprises:
    a first transistor, having a first drain coupled to the internal node, a first source coupled to the current source, and a first gate that receives the complementary control signal; and
    a second transistor having a second source coupled to the first source and also coupled to the current source, having a second drain coupled to the output terminal, and further having a second gate that receives the control signal.

4. A high-speed current switch as recited in claim 1 wherein the second current switch comprises a simple series switch.

5. A high-speed current switch as recited in claim 1 wherein the second current switch comprises a differential pair switch.

6. A high-speed current switch as recited in claim 1 further comprising: a second capacitor, coupled to the internal node.

7. A high-speed current switch comprising:
    a differential switch, utilized to switch a current source between an internal node and an output terminal in response to a control signal;
    an op-amp, having an output coupled to a biasing transistor for establishing an operating voltage at the internal node which is equivalent to a voltage at the output, in response to inputs coupled to the internal node and the output terminal,
    the biasing transistor being coupled to the output of the op-amp by a feedback switch, and further coupled to the internal node by a second current switch when the internal node is selected by the differential switch.

* * * * *